United States Patent [19]
Capodieci

[11] Patent Number: 6,040,118
[45] Date of Patent: Mar. 21, 2000

[54] CRITICAL DIMENSION EQUALIZATION ACROSS THE FIELD BY SECOND BLANKET EXPOSURE AT LOW DOSE OVER BLEACHABLE RESIST

[75] Inventor: Luigi Capodieci, Sunnyvale, Calif.

[73] Assignee: Advanced Micro Devices, Inc., Sunnyvale, Calif.

[21] Appl. No.: 09/183,356

[22] Filed: Oct. 30, 1998

[51] Int. Cl.[7] .................................................. G03F 7/20
[52] U.S. Cl. .......................................... 430/328; 430/394
[58] Field of Search ................................... 430/312, 327, 430/328, 394

[56] References Cited

U.S. PATENT DOCUMENTS

| | | | |
|---|---|---|---|
| 4,474,864 | 10/1984 | Chow et al. | 430/30 |
| 5,180,655 | 1/1993 | Sheats | 430/327 |
| 5,363,171 | 11/1994 | Mack | 355/68 |
| 5,407,785 | 4/1995 | Leroux | 430/312 |
| 5,972,570 | 10/1999 | Bruce | 430/314 |

*Primary Examiner*—Kathleen Duda
*Attorney, Agent, or Firm*—Amin, Eschweiler & Turocy, LLP

[57] ABSTRACT

A method (100) of providing critical dimension uniformity in a radiation sensitive film (104) includes the steps of forming (102) the radiation sensitive film (104) over a substrate (106) and exposing (110) the radiation sensitive film (104) to radiation (56) using a mask (50) having a pattern thereon, wherein a first feature (52) and a second feature (54) on the mask (50) are intended to provide the same critical dimension on the radiation sensitive film (104). The exposure step (110) creates a non-uniform exposure pattern (60) on the radiation sensitive film (104) corresponding to the mask pattern due to various anomalies in the exposure process or in the mask itself. A transferred first feature (84) critical dimension on the radiation sensitive film (104) which corresponds to the first mask feature (52) is larger than the second transferred feature (86) critical dimension which corresponds to the second mask feature (54) due to the radiation non-uniformities or imaging non-uniformities. The method (100) further includes exposing (140) the radiation sensitive film (104) to a blanket radiation exposure (150), wherein the blanket radiation exposure (150) provides effectively a greater dose to the first transferred feature (84) than the radiation dose to the second transferred feature (86) due to variations in a bleaching of the radiation sensitive film (104) at edges (130, 132) of the first and second transferred features (84, 86) due to the first exposure (110). Therefore the blanket exposure step (140) decreases the critical dimension of the first transferred feature (84) more than the critical dimension size of the second transferred feature (86), thereby reducing a difference in the critical dimension of the first and second transferred features (84, 86) which results in improved critical dimension uniformity.

19 Claims, 3 Drawing Sheets

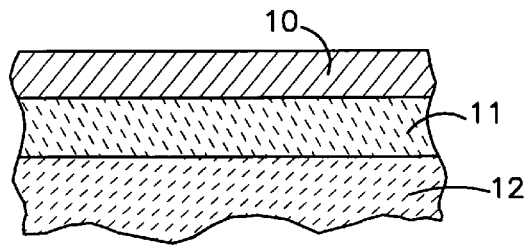
FIGURE 1a
(PRIOR ART)
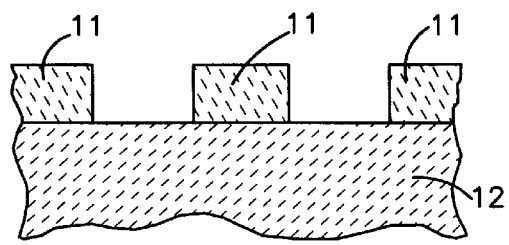
FIGURE 1d
(PRIOR ART)
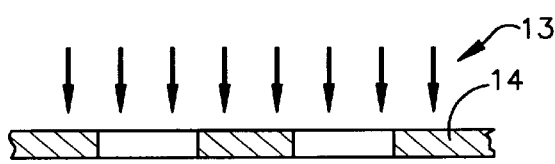
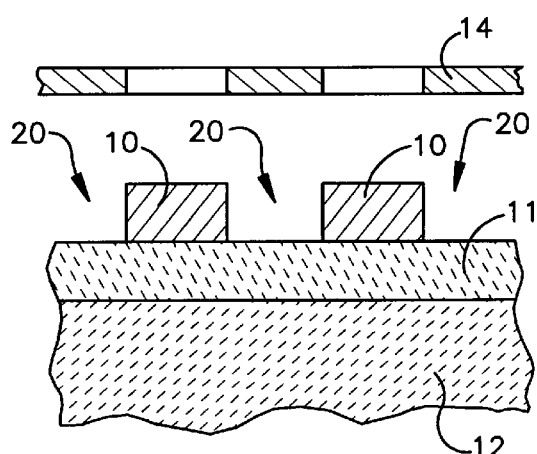
FIGURE 1b
(PRIOR ART)
FIGURE 1e
(PRIOR ART)
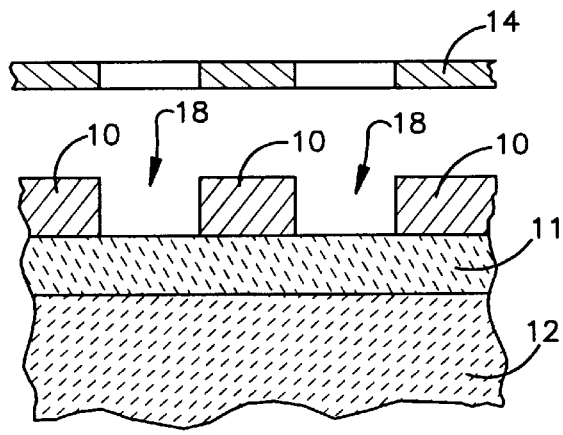
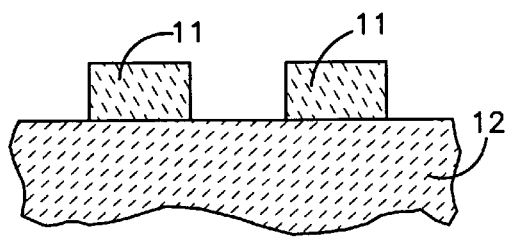
FIGURE 1c
(PRIOR ART)
FIGURE 1f
(PRIOR ART)

$CD_1 > CD_2$
$CD_1 - CD_2 = \Delta_1$

CRITICAL DIMENSION EQUALIZATION ACROSS THE FIELD BY SECOND BLANKET EXPOSURE AT LOW DOSE OVER BLEACHABLE RESIST

FIELD OF THE INVENTION

The present invention generally relates to photolithography, and more particularly relates to a method for providing critical dimension uniformity across the image field through use of an additional exposure during photolithographic processing.

BACKGROUND OF THE INVENTION

Lithography in semiconductor processing relates generally to the process of transferring patterns which correspond to desired circuit components onto one or more thin films which overlie a substrate. One important step within the field of lithography involves optical tools and methods for transferring the patterns to the films which overlie the semiconductor wafer. Patterns are transferred to a film by imaging various circuit patterns onto a photoresist layer which overlies the film on the wafer. This imaging process is often referred to as "exposing" the photoresist layer. The benefit of the exposure process and subsequent processing allows for the generation of the desired patterns onto the film on the semiconductor wafer, as illustrated in prior art FIGS. 1a–1f.

Prior art FIG. 1a illustrates a photoresist layer 10 deposited by, for example, spin-coating, on a thin film 11 such as, for example, silicon dioxide ($SiO_2$) which overlies a substrate 12 such as silicon. The photoresist layer 10 is then selectively exposed to radiation 13 (e.g., ultraviolet (UV) light) via a photomask 14 (hereinafter referred to as a "mask") to generate one or more exposed regions 16 in the photoresist layer 10, as illustrated in prior art FIG. 1b. Depending on the type of photoresist material utilized for the photoresist layer 10, the exposed regions 16 become soluble or insoluble in a specific solvent which is subsequently applied across the wafer (this solvent is often referred to as a developer).

When the exposed regions 16 are made soluble, a positive image of the mask 14 is produced in the photoresist layer 10, as illustrated in prior art FIG. 1c, and the photoresist material is therefore referred to as a "positive photoresist". The exposed underlying areas 18 in the film 11 may then be subjected to further processing (e.g., etching) using the photoresist layer 10 as a hard mask to thereby transfer the desired pattern from the mask 14 to the film 11, as illustrated in prior art FIG. 1d (wherein the photoresist layer 10 has been removed). Conversely, when the exposed regions 16 are mode insoluble, a negative image of the mask 14 is produced in the photoresist 10 layer, as illustrated in prior art FIG. 1e, and the photoresist material is therefore referred to as a "negative photoresist". In a similar manner, the exposed underlying areas 20 in the film 11 may then be subjected to further processing (e.g., etching) using the remaining photoresist layer 10 as a hard mask to thereby transfer the desired pattern from the mask 14 to the film 11, as illustrated in prior art FIG. 1f.

Photolithography systems use both refractive and reflective type optical systems. In either case, non-uniformities in one or more of the illumination system (which provides or supplies the radiation for exposure), the imaging system and the mask construction undesirably cause critical dimension non-uniformities on a target substrate or film surface. That is, two mask features which are intended to be identical exhibit differing critical dimensions at the substrate or film surface across the image field. An exemplary prior art photolithography process which illustrates such a phenomena is illustrated in prior art FIGS. 2a–2c.

Prior art FIG. 2a illustrates a fragmentary cross section of a photomask 50 having a transmissive substrate portion 51 with two patterns 52 and 54 thereon, respectively. The patterns 52 and 54 represent features to be transferred to a target substrate or film such as a silicon wafer, an oxide or a conductive layer (not shown) via radiation (e.g., ultraviolet (UV) light) 56 which passes through the mask 50. The patterns 52 and 54 absorb the radiation 56 which is incident thereon, and thus forms a radiation pattern which is incident on the target substrate or film to form the desired patterns thereon which correspond to the patterns 52 and 54.

Due to a variety of anomalies, such as illumination or exposure non-uniformities, lens imaging aberrations, or mask non-uniformities or defects, the intensity profiles of the radiation 56 at the surface of the target substrate or film corresponding to the patterns 52 and 54 are not the same, as illustrated in prior art FIG. 2b. Prior art FIG. 2b illustrates the radiation intensity profile 60 generated by the mask features 52 and 54. As is evident, a maximum radiation intensity $I_o$ is achieved at the target substrate surface or film in regions 64 where the radiation 56 was permitted to pass through the mask 50. In regions 66 and 68 corresponding to the mask patterns or features 52 and 54, parabolic-type profiles 70 and 72 exist, respectively. Note that the intensity profiles 70 and 72 are not ideal (as illustrated by a dotted line profile 74) due to the diffraction of the radiation caused by the mask features 52 and 54. In addition, and more importantly for this discussion, the profiles 70 and 72 differ from one another although the patterns 52 and 54 which generated the profiles 70 and 72 were intended to be identical (please note that the differences in profiles 70 and 72 are exaggerated in FIG. 2a for easy reference).

Prior art FIG. 2c is a fragmentary plan view of a target substrate or film 80 such as a silicon wafer, insulating layer, or conductive film having a polymethylmethacrylate (PMMA) or some other similar photoresist thereon. As evident from prior art FIG. 2b, the radiation intensity profiles 70 and 72 are not the same, thus the exposure of the radiation sensitive film 82 overlying the target substrate 80 at regions 84 and 86 differ, thus causing the critical dimensions of regions 84 and 86 to similarly differ. That is, the critical dimension of region 84 ($CD_1$) is larger than the critical dimension of region 86 ($CD_2$) because the intensity profile 70 is not as "tight" as the intensity profile 72 (i.e., $CD_1 > CD_2$). Consequently, the various anomalies (e.g., due to illumination, imaging and/or mask non-uniformities) undesirably result in a critical dimension non-uniformity of $CD_1 - CD_2 = \Delta_1$ across the image field. Therefore there is a need in the art for a method of reducing critical dimension non-uniformities across the image field.

SUMMARY OF THE INVENTION

The present invention relates to a method of improving critical dimension uniformity across the image field. The method includes exposing a radiation sensitive film via a photomask followed by a blanket exposure.

According to the present invention, the initial exposure causes less bleaching of the radiation sensitive film at the edges of larger features than at the edges of smaller features across the image field. Therefore the absorption characteristic of the radiation sensitive film at the edges of the larger features is greater than at the edges of the smaller features. Consequently, the subsequent blanket exposure causes the critical dimensions of the larger features to decrease at a faster rate than the critical dimensions of the smaller features, thereby reducing the difference in critical dimension between the larger and smaller features and improving the critical dimension uniformity across the image field.

According to one aspect of the present invention, a bleachable radiation sensitive film such as a UV photoresist is formed over a substrate such as a silicon wafer. A photomask having a pattern including a plurality of features which are intended to have critical dimensions of the same size is used to transfer the pattern to the radiation sensitive film by exposing the radiation sensitive film to the UV radiation via the photomask.

The plurality of features produced in the radiation sensitive film vary due to various processing anomalies such as a non-uniform radiation exposure, mask defects or non-uniformities, or lens aberrations. A second exposure, a low dose blanket exposure, is then performed which substantially minimizes the critical dimension variations between the plurality of features, thus improving the critical dimension uniformity across the image field. The blanket exposure reduces the critical dimension variations between features which are intended to be the same by exploiting an absorption characteristic of the photoresist after the first exposure. Since the larger feature(s) is caused by a radiation intensity profile that bleaches the radiation sensitive film at its edges less than the intensity profile of the smaller feature(s) at its edges, and since the amount of bleaching is inversely related to the capability of the radiation sensitive film to further absorb radiation, the rate of decrease in the critical dimension of the larger feature(s) due to the low dose blanket exposure is greater than the decrease of the smaller feature(s). Consequently, the blanket exposure effectively provides a greater radiation dose to the larger feature(s) than the smaller feature(s) due to the differing bleaching at the edges of the features. Therefore the low dose blanket exposure reduces the variation in the critical dimensions of the features across the image field.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1a is a fragmentary cross section illustrating a prior art semiconductor substrate having a film overlying the substrate which in turn is covered by a photoresist layer;

FIG. 1b is a fragmentary cross section illustrating a prior art method of selectively exposing a photoresist layer using a mask;

FIG. 1c is a fragmentary cross section illustrating a positive photoresist layer after being developed;

FIG. 1d is a fragmentary cross section illustrating a transfer of a mask pattern to the film;

FIG. 1e is a fragmentary cross section illustrating a negative photoresist layer after being developed;

FIG. 1f is a fragmentary cross section illustrating a transfer of a mask pattern to the film;

DETAILED DESCRIPTION OF THE INVENTION

Figure 2A:
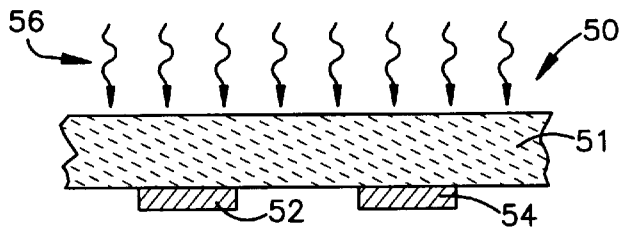
FIG. 2a is a prior art fragmentary cross section diagram illustrating a transmissive photomask having features thereon for transfer to a target substrate or film.
Figure 2B:
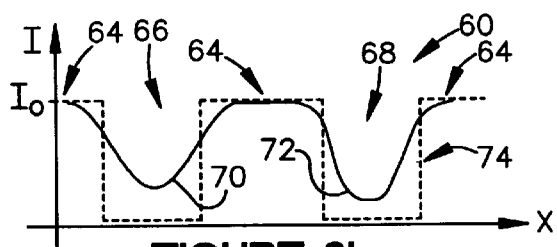
FIG. 2b is a prior art intensity profile illustrating variations in radiation intensity at the target substrate surface or film for features which are intended to be identical, wherein the radiation intensity variations are due to various process or photomask variations or defects.

The following is a detailed description of the present invention made in conjunction with the attached Figures, wherein like reference numerals will refer to like elements throughout. The present invention relates to a method of providing critical dimension uniformity of features across an image field. The present invention includes a first exposure using a mask to expose selected portions of a radiation sensitive film overlying a substrate or film to thereby form a pattern therein, wherein the pattern includes a plurality of features which are intended to be the same size, but which vary due to various anomalies. A blanket exposure is then subsequently performed which causes the critical dimension of a larger feature in the radiation sensitive film to reduce in size at a faster rate than the reduction in the critical dimension of a smaller feature, thus resulting in features within the radiation sensitive film having critical dimensions which are substantially equal. That is, the blanket exposure improves the uniformity of feature critical dimensions across the image field.

According to one embodiment of the present invention, a transmissive mask has two features thereon which are intended to have the same critical dimension. A photoresist film overlying a silicon substrate is exposed with ultraviolet light through the mask so that the mask features are transferred to the photoresist. Due to various processing and equipment anomalies, the two features which are intended to have the same critical dimension exhibit unequal critical dimensions. The photoresist is subject to a second exposure, a low dose blanket exposure, which causes the critical dimensions of the two features to decrease at different rates, wherein the reduction rates preferably are selected to minimize the critical dimension variation between the two features.

The low dose blanket exposure provides critical dimension uniformity because the photoresist edges of the two features were bleached differently due to radiation intensity profile variations for the features caused by one or more of the various anomalies. Thus the absorbency characteristic of the photoresist at the edges of the features is different for the two features. That is, the non-uniform bleaching of the photoresist due to the non-uniform UV intensity profile at the photoresist surface causes the edges of the larger feature to absorb additional energy at a faster rate than the small feature during the subsequent blanket exposure. Thus, the critical dimension of the larger feature reduces at a faster rate than the critical dimension of the smaller feature during the blanket exposure. The duration and dose of the blanket exposure preferably is selected to make the resulting critical dimensions of the two features substantially the same, thus providing critical dimension uniformity across the image field.

Figure 3:
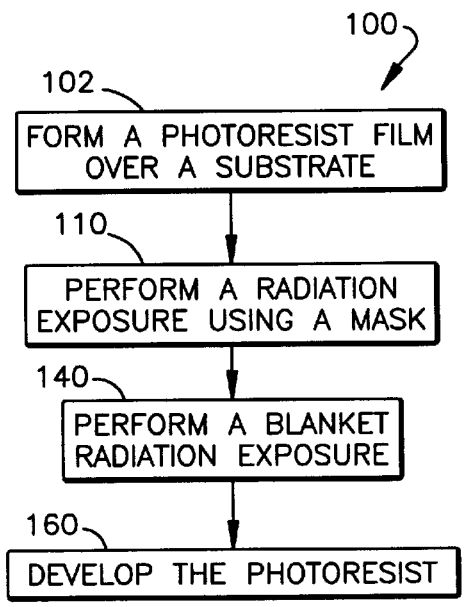
FIG. 3 is a flow chart illustrating a method of reducing critical dimension non-uniformities of patterns across the image field according to the present invention.
Figure 2C:
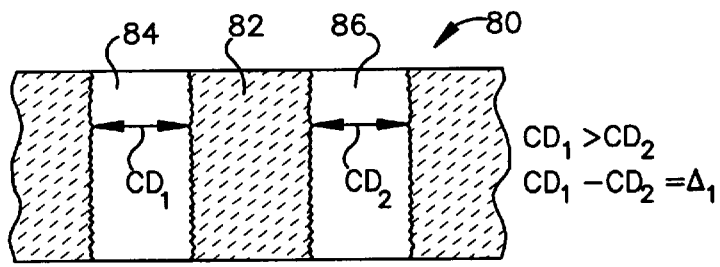
FIG. 2c is a prior art fragmentary plan view of an exposed radiation sensitive film having patterns therein due to exposure which differ in their critical dimensions due to the intensity profile variations of prior art FIG. 2b.
Figure 4A:
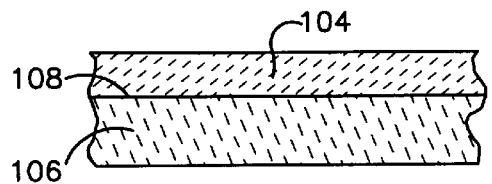
FIGS. 4a–4f are fragmentary cross sections, plan views and a graph, respectively, illustrating the method of FIG. 3 according to the present invention.

Turning now to the Figures, FIG. 3 is a flow chart illustrating a method 100 of improving critical dimension uniformity across the image field in a photolithography process. The method 100 begins at step 102 by forming a radiation sensitive film 104 over a substrate 106, as illustrated in FIG. 4a. Such a radiation sensitive film 104 may 1be any one of various materials and further may differ depending upon the wavelength of the radiation being used during exposure. The present invention is applicable to various wavelength ranges, for example, standard UV wavelengths, deep UV wavelengths, extreme UV wavelengths, X-ray wavelengths, etc., and any radiation sensitive material which is capable of changing states upon exposure (e.g., becoming soluble in the presence of a developer) is contemplated as falling within the scope of the present invention.

According to a preferred embodiment of the present invention, the radiation sensitive film 104 is a DNQ based photoresist (e.g., UV-5 manufactured by Shipley) positive photoresist having a thickness of about 1 micron. Of course, the thickness of the photoresist may vary depending upon the type of photoresist used. In general, for a given photoresist, its thickness will be a function of what it is masking. That is, the material that is being etched or implanted below the photoresist will dictate the optimal thickness for the photoresist film 104. For example, a photoresist film overlying a polysilicon layer may vary between about 0.5 micron to about 1 micron or so. The same photoresist, however, if overlying a metal film, will typically be thicker, for example, about 1.5 microns.

Preferably, the photoresist is substantially bleachable. As is well known by those skilled in the art, photoresists which are tailored for certain wavelength ranges exhibit differing amounts of bleachability. For example, a standard UV photoresist will bleach rather easily while a deep UV photoresist will exhibit very little bleaching during exposure. Because the present invention utilizes the bleachability of the photoresist, a deep UV photoresist will preferably incorporate an additive to increase its bleachability. According to a preferred embodiment of the present invention, the photoresist 104 has a bleachability which may be characterized by the Dill parameters of A and B as follows: A is between about 0.7 and about 1.2 and B is between about 0.01 and about 0.06, respectively. The Dill parameters are well known parameters which characterize the bleachability of the resist and are well known by those of skill in the art. For additional information on the Dill parameters and bleachability, see "Characterization of Positive Photoresist", Dill et al., IEEE Transactions on Electron Devices, ED-22, No. 7:445 (1975), which is hereby incorporated by reference in its entirety.

In addition, the substrate 106 is preferably a semiconductor wafer such as silicon, however, alternative substrate materials such as glass, sapphire, etc. may also be utilized and are contemplated as falling within the scope of the present invention. Furthermore, the radiation sensitive film or photoresist 104 may overlie various layers on a substrate such as polysilicon, various types of metallization such as aluminum, copper, etc., or insulating layers such as an oxide or a nitride.

Preferably, the photoresist deposition process includes an underlying substrate cleaning step to remove any contaminants on the substrate surface 108. Such cleaning may include a dehydration bake step to remove any absorbed moisture on the substrate surface 108 which may otherwise adversely impact the adhesion of the photoresist 104. Such a dehydration bake may include, for example, a multi-step process to liberate water molecules at 150–200° C. and loosely held water of hydration at about 400° C. After dehydration baking, the substrate 106 may then be primed with a pre-resist coating (e.g., hexamethyldisilazane (HMDS)) to improve subsequent photoresist adhesion. Such a preresist coating is preferably spin-coated, but may also be formed by vapor priming. In the spin coat process, the pre-resist is dispensed and the substrate is spun at, for example, about 3000 rpm for about 20–30 seconds to create approximately a monolayer. In vapor priming, the pre-resist coating may be deposited in vapor form in a deposition chamber according to conventional methods.

Once the underlying substrate surface 108 is clean, the preferably uniform, adherent, defect free polymeric photoresist film 104 is dispensed over the substrate 106, wherein the photoresist film 104 preferably has a thickness of about 1 micron. Preferably, the photoresist 104 is formed by spin coating which includes the dispensing of a fixed amount of a photoresist solution onto the substrate surface 108 and spinning the substrate 106 at a rotational speed of, for example, about 3000–7000 rpm for about 20–30 seconds. Alternatively, however, other methods of forming the photoresist film 104 may be implemented and any such formation process is contemplated as falling within the scope of the present invention. In order to ensure good photoresist uniformity, the resist viscosity is preferably controlled by controlling the ambient temperature to within ±1° C.

After the spin-coating, the photoresist film 104 is preferably soft-baked to drive off solvent from the spun-on resist, improve the photoresist adhesion, and anneal the stresses caused by the shear forces which occurred in the spinning process. The degree of soft-baking affects the amount of residual solvent in the photoresist 104 and thus influences both the exposure and the development characteristics of the photoresist 104. Preferably then, the temperature and duration of the soft-bake step is optimized to provide the desired balance between the photoresist exposure and development behavior, which may vary based on the type of photoresist material used as well as the desired device application.

Figure 4B:
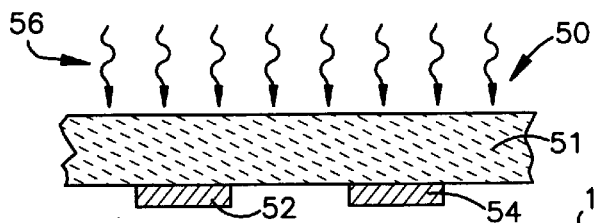

Once the photoresist film 104 is formed over the substrate 106 or other film, a radiation exposure is performed at step 110 using the photomask 50, as illustrated in FIGS. 3 and 4b. As shown in FIG. 4b, the exposure step 110 uses the same mask 50 of prior art FIG. 2a and the exposure is provided in a similar manner using the radiation 56 which transmits through the mask 50. Although the preferred embodiment of the present invention utilizes a transmissive mask 50 for a refractive lithography system, the present invention is also applicable to a reflective mask in a reflective type lithography system and such a reflective implementation is contemplated as falling within the scope of the present invention.

The exposure step 110 preferably includes exposing the photoresist film 104 through the mask 50 using radiation 56 having a wavelength of 248 nm at a dose of about 10–15 mJ/cm$^2$. Due to the existence of one or more of the aforementioned anomalies, the radiation intensity profile 60 at the photoresist 104 is not uniform, as illustrated in FIG. 4c. Since the radiation intensity profile 70 is less "tight" than the intensity profile 72, the critical dimension ($CD_1$) of the first feature 84 is larger than the critical dimension ($CD_2$) of the second feature 86. In addition, since a slope 120 of the intensity profile 70 is less than a slope 122 of the intensity profile 72, the amount of radiation exposure at the edges 130 and 132 of the features 84 and 86 also differ, as labeled in FIG. 4d. Note that the difference in the profiles 70 and 72 are exaggerated in FIG. 4d for easy reference.

As discussed supra, the photoresist 104 is a bleachable photoresist or a photoresist containing a bleaching additive and consequently the amount of radiation exposure to which the photoresist 104 is subjected impacts the absorbency characteristic of the photoresist 104. As seen in FIGS. 4c and 4d, due to the slope 120 of the intensity profile 66 being less than the slope 122 of the intensity profile 68, the edges 130 of the feature 84 experience less exposure intensity during the exposure step 110 than the edges 132 of the feature 86, thus the edges 130 are less bleached than the edges 132 and are more absorbent with respect to any additional exposure. This characteristic of the photoresist 104 after the first exposure step 110 is exploited in the present invention at step 140 of FIG. 3 by performing a second exposure; a low dose blanket exposure across the photoresist 104, as illustrated in FIG. 4e.

Figure 4E:
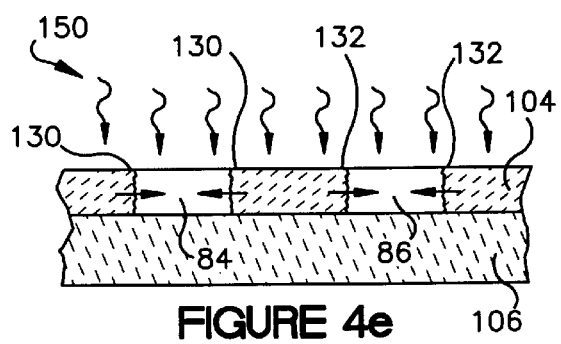
Figure 4C:
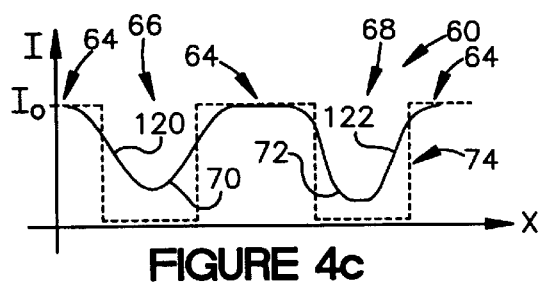

As seen in FIG. 4e, step 140 includes exposing the photoresist 104 with a low dose blanket exposure of radiation 150. The blanket exposure (step 140) is preferably provided at a dose of about 5% to about 10% of the first exposure (step 110), for example, a dose of about 1 mJ/cm$^2$ or more. The blanket exposure 140 causes the critical dimension of the feature 84 to decrease at a faster rate than the critical dimension of the feature 86 because the edges 130 are less bleached than the edges 132. Therefore the blanket exposure of step 140 effectively provides a greater dose to the edges 130 than the edges 132 due to the absorbency differences at the edges 130 and 132, respectively.

Figure 4F:
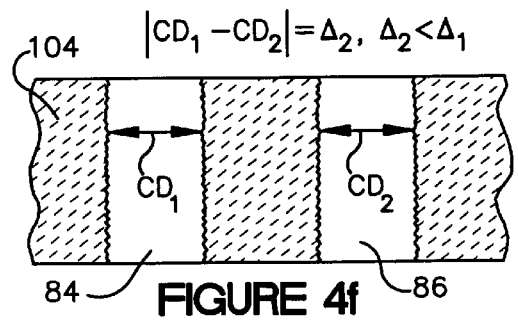
Figure 4D:
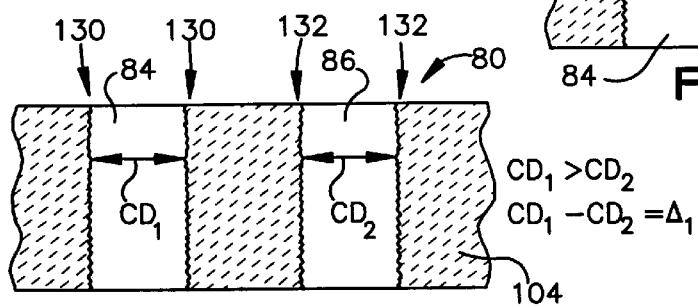

The results of the low dose blanket exposure (step 140) may best be seen in FIG. 4f, which is a plan view of the photoresist film 104 after the blanket exposure of step 140. As seen in FIG. 4f, boh of the features 84 and 86 are smaller than after the first exposure of step 110, however, due to the increased photoresist bleaching at the edges 132 compared to the photoresist bleaching at the edges 130, the critical dimension of the second feature 86 decreases at a slower rate than the critical dimension of the first feature 84. Consequently, the features 84 and 86 after the blanket exposure of step 140 are substantially equal. To the extent that the features 84 are not exactly equal (which is most likely since an exact unity is improbable), the difference in the critical dimensions of the features $CD_1-CD_2$ (absolute value) is $\Delta_2$ and $\Delta_2$ is substantially less than the variation $\Delta_1$ after step 110 ($CD_2<CD_1$) and which is typical in prior art processes. Consequently, the blanket exposure of step 140 provides a substantial improvement in critical dimension uniformity across the image field.

Once the low dose blanket exposure of step 140 is completed and the critical dimensions of the features 84 and 86 are made substantially uniform, the photoresist 104 is developed at step 160, as illustrated in FIG. 3. According to an exemplary embodiment of the present invention, a positive resist developer, such as an alkaline solution diluted with water is used. Of course, other type developer solutions may also be utilized. Various development techniques may be used and any such technique is contemplated as falling within the scope of the present invention. For example, an immersion development process may be used, wherein a plurality of substrates are batch immersed in a bath of developer solution having a predetermined temperature for a predetermined period of time. Alternatively, for example, a spray development process may be employed. In such a development process, the developer solution is directed across the photoresist 104 which resides on the substrate 106 by a fan-type spray in an iterative fashion. Preferably, the development process is selected to provide a minimal amount of resist degradation (thinning), a minimal amount of development time, and cause minimized pattern distortion or swelling in the photoresist 104.

Once the development step 160 is complete, the photoresist features 84 and 86 remain on the substrate 106. The photoresist features 84 and 86 have critical dimensions which are substantially uniform and which may then be utilized to facilitate further processing according to conventional techniques.

The present invention is applicable to lithography both in the reduction of critical dimension non-uniformities on devices as well as on masks.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of providing critical dimension uniformity in a radiation sensitive film, comprising the steps of:

forming a radiation sensitive film over a substrate, wherein the radiation sensitive film exhibits substantial bleaching upon an exposure thereof;

exposing the radiation sensitive film to radiation using a mask having a pattern thereon, wherein a first feature and a second feature on the mask are intended to provide the same critical dimension on the radiation sensitive film, wherein the exposing forms an exposure pattern on the radiation sensitive film corresponding to the mask pattern, and wherein a transferred first feature critical dimension on the radiation sensitive film corresponding to the first mask feature is larger than the second transferred feature critical dimension on the radiation sensitive film corresponding to the second mask feature due to radiation non-uniformities or imaging non-uniformities; and exposing the radiation sensitive film to a blanket radiation exposure, wherein the blanket radiation exposure has a dose which is substantially less than the exposure using the mask, and wherein the blanket exposure provides effectively a greater dose to the first transferred feature than a radiation dose to the second transferred feature due to variations in a bleaching of the radiation sensitive film at the first and second transferred features, thus decreasing the critical dimension of the first transferred feature more than the critical dimension size of the second transferred feature, thereby reducing a difference in the critical dimension of the first and second transferred features which results in improved critical dimension uniformity.

2. The method of claim 1, wherein the substrate comprises silicon or glass.

3. The method of claim 1, wherein the radiation sensitive film comprises a photoresist.

4. The method of claim 1, wherein the radiation comprises ultraviolet radiation, deep ultraviolet radiation, extreme ultraviolet radiation, or X-rays.

5. The method of claim 1, further comprising the step of developing the exposed radiation sensitive film.

6. The method of claim 1, wherein exposing the radiation sensitive film using the mask comprises subjecting the radiation sensitive film to a dose of radiation of about 10 mJ/cm$^2$ to about 15 mJ/cm$^2$.

7. The method of claim 6, wherein the dose of the blanket exposure is about 1 mJ/cm$^2$.

8. The method of claim 1, wherein the dose of the blanket exposure is about 5% to about 10% of the exposure using the mask.

9. The method of claim 1, wherein an intensity profile corresponding to the first transferred feature has a slope which is less than a slope of an intensity profile corresponding to the second transferred feature, and wherein the lesser slope results in a lesser amount of bleaching at edges of the first transferred feature than at edges of the second transferred feature.

10. The method of claim 1, wherein the radiation sensitive film comprises a UV photoresist having a bleachability characterized by Dill parameters of A and B, wherein A has a range of about 0.7 to about 1.2 and B has a range of about 0.01 to about 0.06, respectively.

11. The method of claim 1, wherein the radiation sensitive film comprises a deep UV photoresist having a bleaching additive incorporated therein.

12. The method of claim 11, wherein the deep UV photoresist having a bleaching additive therein has a bleachability characterized by Dill parameters of A and B, wherein A has a range of about 0.7 to about 1.2 and B has a range of about 0.01 to about 0.06, respectively.

13. A method of providing critical dimension uniformity across an image field, comprising the steps of:
 forming a radiation sensitive film over a substrate, wherein the radiation sensitive film exhibits substantial bleaching upon an exposure thereof;
 performing a first exposure of the radiation sensitive film through a mask, thereby forming at least two features having critical dimensions which are not uniform; and
 performing a second exposure of the radiation sensitive film, wherein the second exposure is a blanket exposure having a dose which is less than the first exposure, and wherein the second exposure causes the nonuniformity of the critical dimensions of the at least two features to decrease.

14. The method of claim 13, wherein the second exposure has a dose which is about 5% to about 10% of a dose of the first exposure.

15. The method of claim 13, wherein the first exposure has a dose of about of about 10 mJ/cm$^2$ to about 15 mJ/cm$^2$ and the second exposure has a dose of about 1 mJ/cm$^2$.

16. The method of claim 13, wherein the first exposure has a non-uniform intensity profile at a surface of the radiation sensitive film, and wherein the non-uniform intensity profile causes less bleaching at edges of one of the at least two features than at edges of the other of the at least two features.

17. The method of claim 10, wherein the radiation sensitive film comprises a UV photoresist having a bleachability characterized by Dill parameters of A and B, wherein A has a range of about 0.7 to about 1.2 and B has a range of about 0.01 to about 0.06, respectively.

18. The method of claim 10 wherein the radiation sensitive film comprises a deep UV photoresist having a bleaching additive incorporated therein.

19. The method of claim 18, wherein the deep UV photoresist having a bleaching additive therein has a bleachability characterized by Dill parameters of A and B, wherein A has a range of about 0.7 to about 1.2 and B has a range of about 0.01 to about 0.06, respectively.

* * * * *

UNITED STATES PATENT AND TRADEMARK OFFICE
CERTIFICATE OF CORRECTION

PATENT NO.: 6,040,118

DATED: March 21, 2000

INVENTOR(S): Luigi Capodieci

It is certified that error appears in the above-identified patent and that said Letters Patent is hereby corrected as shown below:

Column 5, line 13, please omit the "1" before the word "be".

Column 7, line 37, please replace the word "boh" with the word --both--.

Signed and Sealed this

Nineteenth Day of December, 2000

Attest:

Q. TODD DICKINSON

*Attesting Officer*     *Commissioner of Patents and Trademarks*